United States Patent
Goetzke

(10) Patent No.: US 6,809,510 B2
(45) Date of Patent: Oct. 26, 2004

(54) CONFIGURATION IN WHICH WAFERS ARE INDIVIDUALLY SUPPLIED TO FABRICATION UNITS AND MEASURING UNITS LOCATED IN A FABRICATION CELL

(75) Inventor: Michael Goetzke, Immenstaad (DE)

(73) Assignee: Infineon Technologies AG, Munich (DE)

( * ) Notice: Subject to any disclaimer, the term of this patent is extended or adjusted under 35 U.S.C. 154(b) by 459 days.

(21) Appl. No.: 10/015,150

(22) Filed: Nov. 7, 2001

(65) Prior Publication Data

US 2002/0064954 A1 May 30, 2002

Related U.S. Application Data

(63) Continuation of application No. PCT/DE00/01451, filed on May 5, 2000.

(30) Foreign Application Priority Data

May 7, 1999 (DE) .......................................... 199 21 245

(51) Int. Cl.7 ............................................... G01R 31/02
(52) U.S. Cl. .................... 324/158.1; 324/765; 700/112; 414/273
(58) Field of Search ............................. 324/765, 158.1; 700/112, 99, 116, 121; 414/273, 935, 937, 939, 940, 222.02; 364/468.01, 468.02, 468.13, 468.14, 468.22, 468.23; 395/601, 611, 614, 615; 438/14–19

(56) References Cited

U.S. PATENT DOCUMENTS

| 5,164,905 | A | | 11/1992 | Iwasaki et al. |
| 5,202,716 | A | | 4/1993 | Tateyama et al. |
| 5,443,346 | A | * | 8/1995 | Murata et al. ......... 414/222.13 |
| 5,495,417 | A | * | 2/1996 | Fuduka et al. .............. 700/121 |
| 5,536,128 | A | | 7/1996 | Shimoyashiro et al. |
| 5,777,876 | A | * | 7/1998 | Beauchesne ................. 700/95 |
| 5,803,932 | A | | 9/1998 | Akimoto et al. |

FOREIGN PATENT DOCUMENTS

| DE | 195 14 037 A 1 | 10/1996 |
| EP | 0 359 525 A2 | 3/1990 |
| JP | 08268512 A | 10/1996 |

* cited by examiner

Primary Examiner—Kamand Cuneo
Assistant Examiner—Jimmy Nguyen
(74) Attorney, Agent, or Firm—Laurence A. Greenberg; Werner H. Stemer; Ralph E. Locher

(57) ABSTRACT

A configuration for treating wafers in at least one clean room includes a configuration of production units and measuring units that receive wafers via a transport system for transporting cassettes. Several functionally allocated production units and/or measuring units are combined to form a manufacturing cell which is provided with a loading and unloading station for receiving and forwarding cassettes with wafers. Individual wafers can be supplied to the production units and/or measuring units within the manufacturing cell in order to be treated.

22 Claims, 3 Drawing Sheets

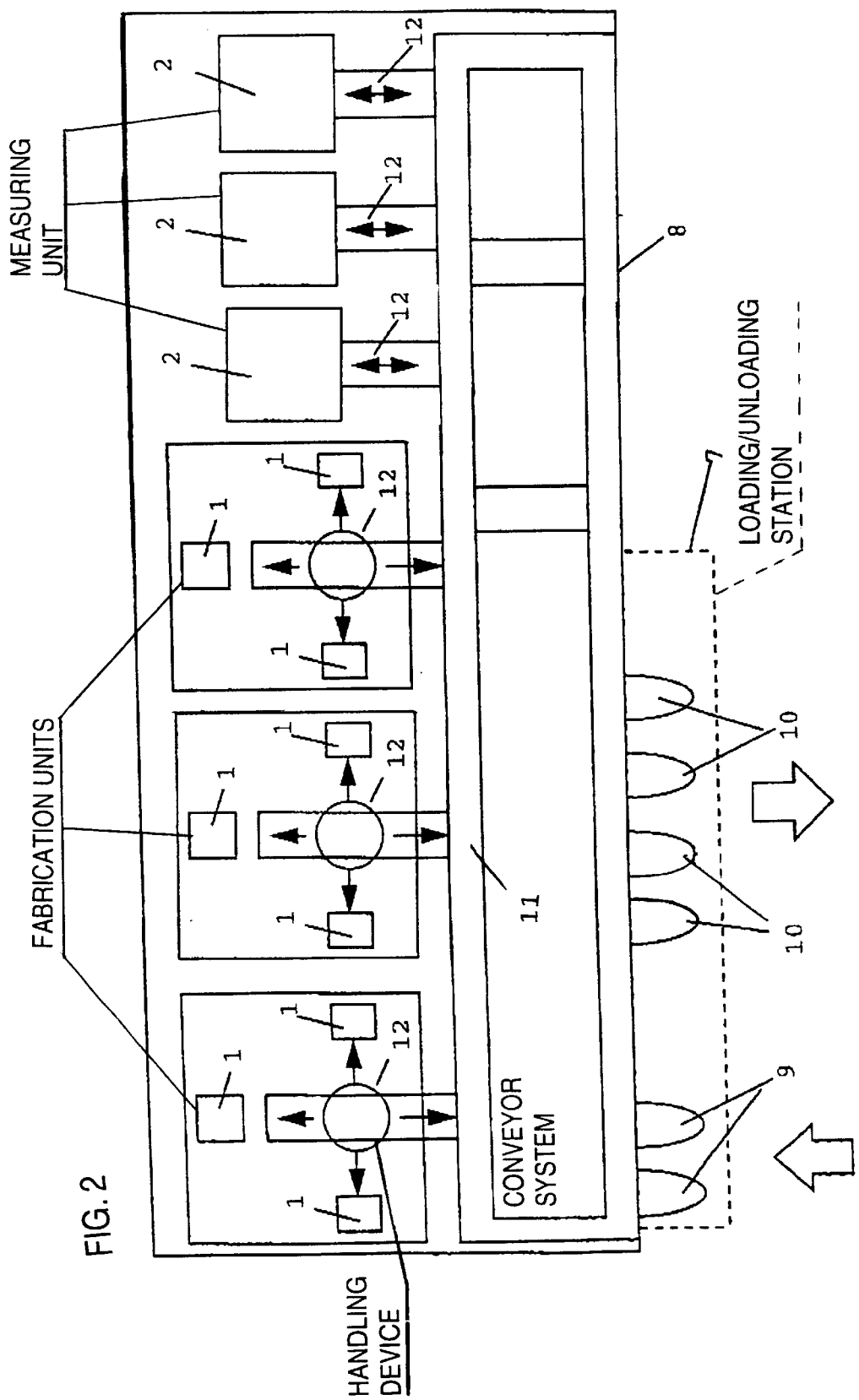

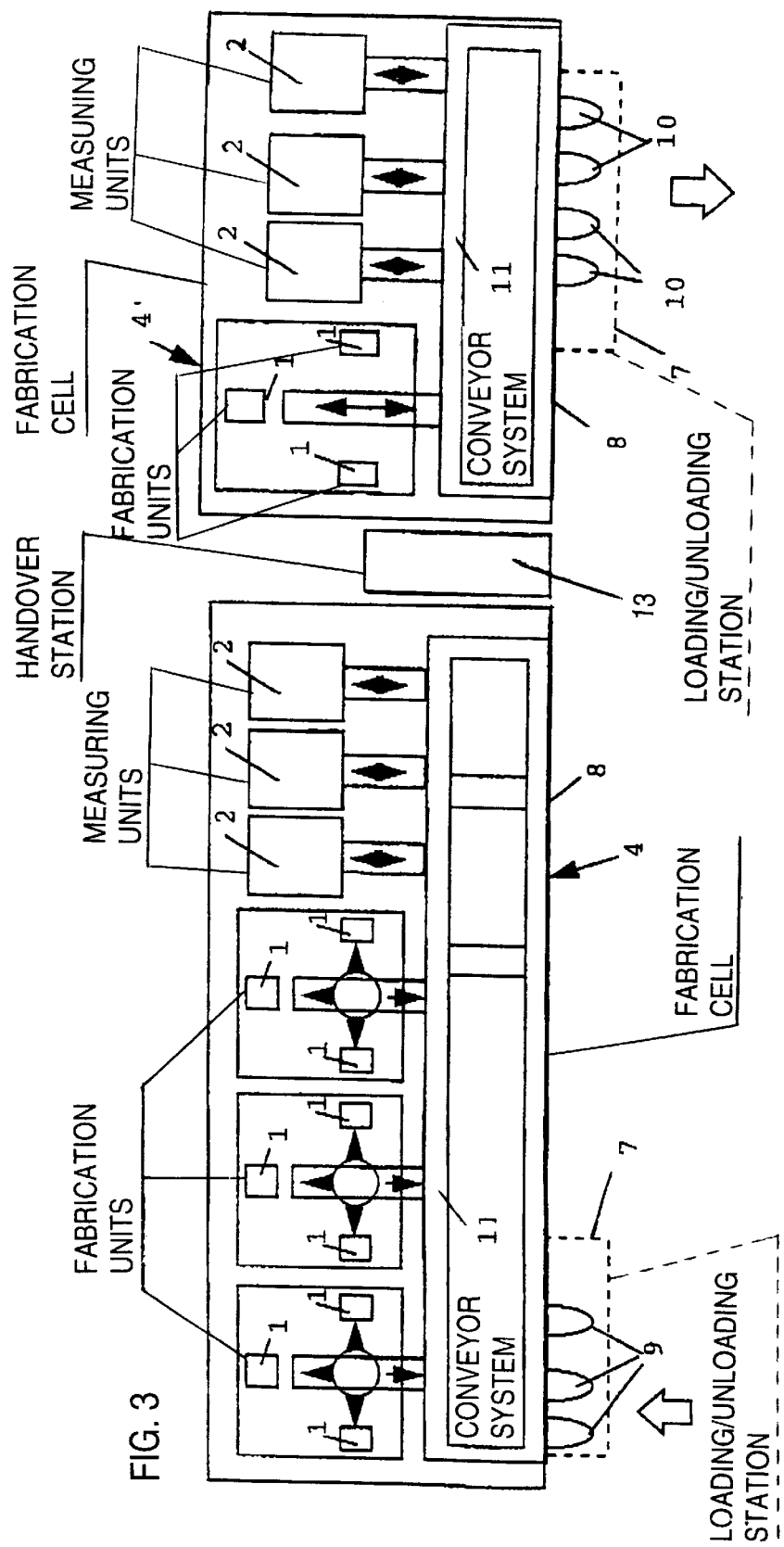

CONFIGURATION IN WHICH WAFERS ARE INDIVIDUALLY SUPPLIED TO FABRICATION UNITS AND MEASURING UNITS LOCATED IN A FABRICATION CELL

CROSS-REFERENCE TO RELATED APPLICATION

This application is a continuation of copending International Application No. PCT/DE00/01451, filed May 5, 2000, which designated the United States.

BACKGROUND OF THE INVENTION

Field of the Invention

The invention relates to a configuration for processing wafers having fabrication units, measuring units, and a transport system for conveying a cassette of the wafers between the fabrication units and the measuring units.

These types of devices contain a number of fabrication units, with which various finishing steps are carried out. These finishing steps include various treatment steps in etching processes, wet chemical processes, diffusion processes, and various cleaning techniques such as CMP (Chemical Mechanical Polishing). One or more fabrication units are provided for each of these finishing steps. In addition, measuring units are provided, in which the quality of the wafer processing can be checked.

The overall fabrication process is subject to stringent purity requirements, for which reason the fabrication units and measuring units are disposed in a clean room or a system of clean rooms.

The wafers are supplied to the individual fabrication units in cassettes in predetermined batch sizes by way of a transport system. The wafers are also removed in cassettes by way of the transport system, after being processed in the fabrication and measuring units.

The transport system typically includes a conveyor system, which is constructed in the form of roll conveyors, for instance. A predetermined number of cassettes are supplied to a fabrication unit or measuring unit for processing via the transport system. The fabrication unit or measuring unit respectively includes a loading and unloading station, via which a respective cassette with wafers can be inserted. After all of the wafers of a cassette have been processed in the fabrication unit or measuring unit, the cassette with the wafers is output again by way of the loading and unloading station and is transported out via the conveyor system.

Because of the relatively long transport paths between the individual fabrication and measuring units and the different processing capacities of the fabrication and measuring units, storage systems, such as stockers, are provided in near the fabrication and measuring units, and these stockers are a component of the transport system. Cassettes with wafers can be stored in a stocker under clean-room conditions and can be fed to the individual fabrication and measuring units as needed.

One disadvantage of this method is the large installation expenditure for the transport system. Specifically, storing the cassettes in the stockers is time-consuming and costly. Another disadvantage is that the conveyor system consists of linear systems such as roll conveyors, which can only be branched to a limited degree. The general result of this is that the construction of the transport system substantially determines the configuration of the fabrication units and measuring units. Therefore, the fabrication units and measuring units are usually not arranged in accordance with their functionalities. This leads to a certain inefficiency in the transport of individual wafers.

A further disadvantage is the need to wait for all of the wafers of a cassette to be processed in a fabrication or measuring unit before the entire batch in the cassette is forwarded to the transport system via the loading and unloading station in order to be transported out. If, for example, the wafers of a cassette are first processed in a fabrication unit, and then the processing quality is checked in a measuring unit, then all of the wafers of a cassette must be processed before the checking process can occur in the measuring unit. Only then can subsequent additional measures be taken in dependence upon the measurement results. The throughput times of the cassettes with the wafers through the system are therefore undesirably high.

U.S. Pat. No. 5,803,932 describes a processing system for processing wafers. This processing system includes a loading/unloading section, a processing section and an interface section. In addition, a transport mechanism and at least two waiting sections are provided.

The transport mechanism is located between the loading/unloading section and the interface section. A plurality of processing units, which form the processing section, are disposed on either side of the transport mechanism. The wafers are transported on the transport mechanism either in the direction of the loading/unloading section or in the direction of the interface section.

U.S. Pat. No. 5,443,346 describes a transport system for transporting wafers in a clean room. The wafers are first transported in first cassettes by way of an interbay conveyor system, arriving at interface equipment. In the interface equipment, the wafers are removed from the first cassettes and reloaded into second cassettes in a predetermined arrangement. Then, the second cassettes are successively fed to different processing units by way of an intrabay conveyor system, where the wafers are processed in a variety of ways.

Published German Patent Application DE 195 14 037 A1 relates to a transport device for transporting substrates. The transport device is constructed as a turntable, which is driven at a constant cycle frequency. The substrate can be fed to a processing station, which is provided outside the turntable by means of a rotating substrate gripper.

Published Japanese Patent Application JP 08268512 A relates to a storage unit for storing substrates. The storage unit includes a sorting unit, by means of which the substrates are automatically sorted and moved into or out of the storage unit in cassettes.

SUMMARY OF THE INVENTION

It is accordingly an object of the invention to provide a configuration for processing wafers which overcomes the above-mentioned disadvantages of the prior art apparatus of this general type. In particular, it is an object of the invention to optimally minimize the throughput time for processing a wafer in configuration of the above described type.

With the foregoing and other objects in view there is provided, in accordance with the invention, a configuration for processing wafers that includes: a plurality of fabrication units for carrying out individual fabrication steps; a plurality of measuring units for checking the fabrication steps; a transport system for transporting cassettes having a predetermined batch size of wafers, the transport system connecting the plurality of the fabrication units and the plurality of the measuring units; and a fabrication cell including a combination of functionally allocated units selected from the group consisting of the plurality of the fabrication units and the plurality of the measuring units. The fabrication cell includes a loading and unloading station for receiving the cassettes with the wafers and for outputting the cassettes with the wafers. Individual wafers are supplied in a parallel manner to the functionally allocated units in the fabrication cell. The plurality of the fabrication units, the plurality of the measuring units, the transport system, and the fabrication cell are located in at least one clean room.

In accordance with an added feature of the invention, one or more fabrication cells are provided, in which several fabrication and/or measuring units are combined. Each fabrication cell includes a loading and unloading station for delivering cassettes, with wafers, in and out. Within the fabrication cells, the wafers can be individually supplied to the fabrication units and/or measuring units in a parallel fashion.

The fabrication units and measuring units are allocated according to function, whereby the functions of the individual fabrication and measuring units expediently make up a fabrication process.

The essential advantage of such a fabrication cell is that the wafers of a cassette no longer need to be serially processed in the individual fabrication units and measuring units. Rather, the wafers can be individually fed to the fabrication and measuring units as needed, making it possible to process the wafers within a fabrication cell in a parallel fashion. What is particularly advantageous is the ability to feed a wafer to the allocated measuring unit immediately after it is processed, so that the processing quality can be checked. The fabrication cell advantageously may additionally include a suitable fabrication unit in which the wafer can be post-processed immediately after the check in the measuring unit.

The parallelism of the wafer finishing steps in the fabrication cell prevents unnecessary wait times at the individual fabrication and measuring units, so that a low throughput time of the wafers through the fabrication cell can be achieved.

A further advantage is that the individual wafers are suppliable to the fabrication and measuring units within a fabrication cell without intermediate storage. On one hand, this further reduces the throughput times of the wafers through the configuration. On the other hand, substantial cost savings are achieved by forgoing storage systems.

The construction of the overall configuration is substantially simplified by combining fabrication and/or measuring units into fabrication cells. In particular, the transport system for transporting cassettes with wafers between the individual fabrication cells can have a simple construction.

In accordance with an additional feature of the invention, a sub-transport system transports individual wafers between the functionally allocated units (fabrication and/or measuring units) in the fabrication cell.

In accordance with another feature of the invention, handling devices are provided at the conveyor system, for feeding individual ones of the wafers to the functionally allocated units (fabrication and/or measuring units) of a fabrication cell and for removing the individual wafers from the functionally allocated units of the fabrication cell.

In accordance with a further feature of the invention, there is provided a first fabrication cell including a first sub-transport system, and a second fabrication cell linked to the first fabrication cell. The second fabrication cell includes a second sub-transport system. A handover station connects the first sub-transport system and the second sub-transport system to link together the first fabrication cell and the second fabrication cell.

In accordance with a further additional feature of the invention, the first fabrication cell includes a loading station for receiving the cassettes with the wafers; and the second fabrication cell includes an unloading station for outputting the cassettes with the wafers.

Other features which are considered as characteristic for the invention are set forth in the appended claims.

Although the invention is illustrated and described herein as embodied in apparatus for fabricating wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic representation of a fabrication cell as represented in FIG. 1; and FIG. 3 is a schematic representation of two linked fabrication cells.

DESCRIPTION OF THE PREFERRED EMBODIMENTS

Figure 1:
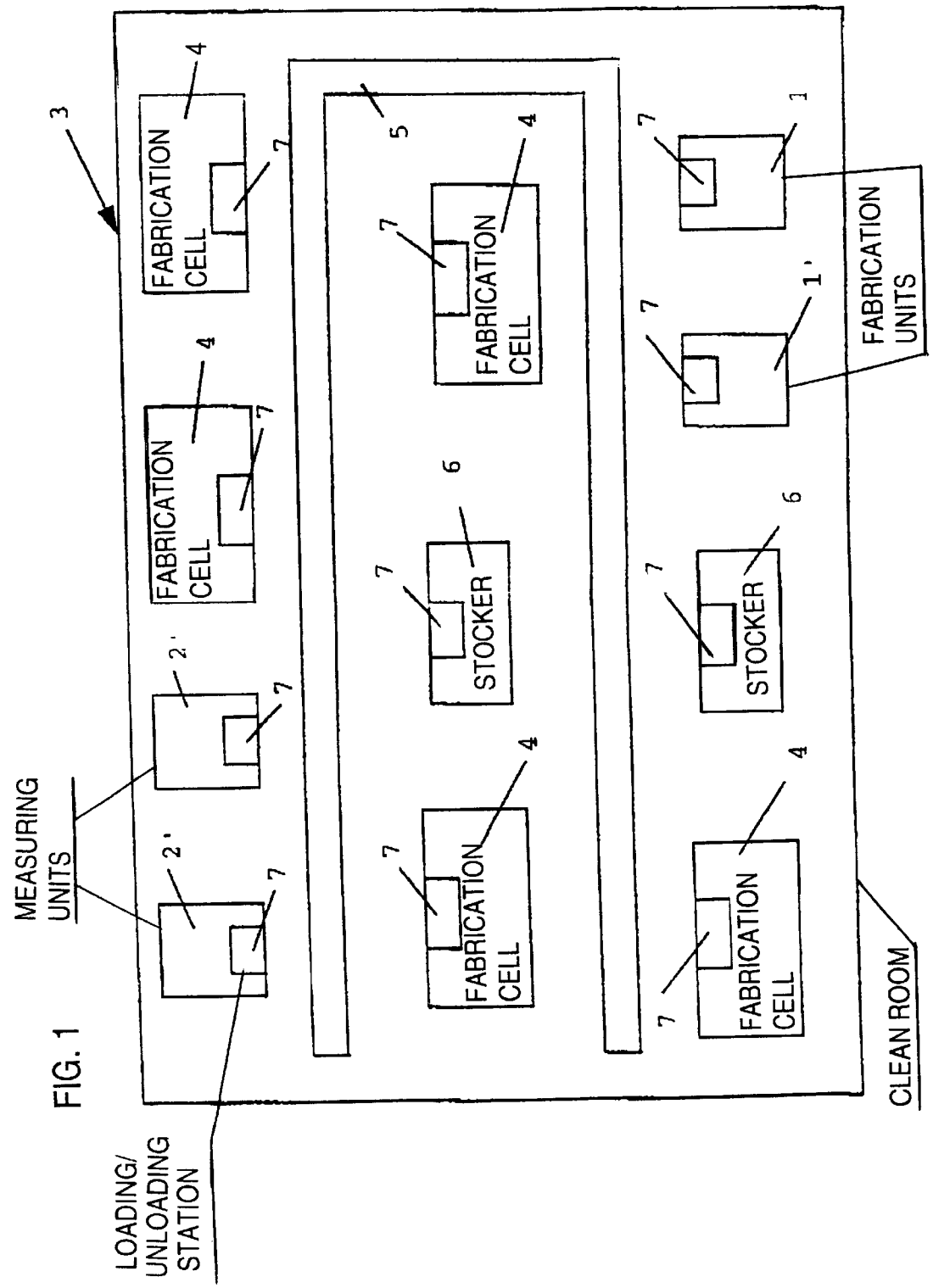
FIG. 1 is a schematic view of a system for processing wafers having several fabrication cells.

Referring now to the figures of the drawing in detail and first, particularly, to FIG. 1 thereof, there is shown an exemplary embodiment of a configuration or system for processing wafers. The system includes a plurality of fabrication units 1, 1' for executing finishing steps that are necessary for processing the wafers. These finishing steps include treatment processes in etching processes, wet chemical processes, diffusion processes, and purification processes. One or more fabrication units 1, 1' can be provided for each of these treatment processes. The system additionally includes a plurality of measuring units 2, 2', in which the results of the individual finishing steps are checked. The fabrication units 1, 1' and measuring units 2, 2' are disposed in a clean room 3. Alternatively, the system can be distributed over a system of clean rooms 3.

In the exemplary embodiment of the system represented in FIG. 1, a small number of fabrication units 1' and measuring units 2' are separately disposed in the clean room 3. The majority of the fabrication units 1 and measuring units 2 are disposed in fabrication cells 4. In a particularly expedient embodiment, which is not represented in the figures, all of the fabrication units 1 and measuring units 2 are integrated into fabrication cells 4, so that there are no longer any fabrication units 1' or measuring units 2' separately disposed in the clean room 3.

The separately disposed fabrication units 1' and measuring units 2' and the individual fabrication cells 4 are connected to one another by a transport system.

The transport system contains a conveyor system 5 and a storage system 6. The conveyor system 5 can be formed by a system of roll conveyors. Stockers are preferably used as storage systems 6.

On the conveyor system 5, wafers, which are arranged in cassettes (which are not represented) are transported in prescribed batch sizes. For transporting the cassettes in and out, the separately disposed fabrication and measuring units 1', 1', 2' and the fabrication cells 4 each include a respective loading and unloading station 7. In order to guarantee a sufficient supply of wafers to these units, the storage systems 6 in which the cassettes are temporarily stored are provided at suitable locations. The storage systems 6 likewise include a loading and unloading station 7 for loading and unloading the cassettes.

The separately disposed fabrication and measuring units 1', 2' are respectively supplied with a cassette having wafers via the loading and unloading station 7. After the same fabrication step has been performed for all of the wafers in the fabrication unit 1', or after the same measuring process has been performed for all of the wafers in this cassette in the measuring unit 2', the corresponding cassette with the wafers is fed to the transport system again via the loading and unloading station 7.

Likewise, cassettes with wafers are fed to the fabrication cells 4 in prescribed batch sizes. An exemplary embodiment of the inventive fabrication cell 4 is represented in detail in FIG. 2. The fabrication cell 4 includes a predetermined number of fabrication units 1 and measuring units 2, which are functionally allocated to one another.

The fabrication cell 4 can be spatially separated from the remaining units of the system by wall elements 8. Disposed at one of the these wall elements 8 is the loading and unloading station 7 via which cassettes with wafers are picked up from the transport system and delivered to same. In the present exemplary embodiment, the loading and unloading station 7 includes several ports 9 for cassette supply and several ports 10 for cassette removal. The input and output of cassettes can be accomplished manually or with the aid of handling devices, which are not represented.

According to the invention, the individual fabrication units 1 and measuring units 2 within the fabrication cell 4 are not supplied with whole cassettes containing wafers, but rather with individual wafers.

In order to guarantee tracking of the wafers during the processing procedures within the fabrication cell 4, the individual wafers are identifiable by reference to markings. For example, marks are made on the wafers, which can be identified by detection systems. These marks are expediently made on the outer margin regions of the wafers, which are separated from the useful surface in the interior of the wafers as waste subsequent to the processing. In particular, the marks may consist of bar codes, which are identifiable using bar code readers.

The loading and unloading station 7 and the fabrication and measuring units 1, 2 of a fabrication cell 4 are connected to one another by a sub-transport system. On the sub-transport system, the wafers, which are supplied via the loading and unloading station 7, which are borne in cassettes, are singularized. The singularized wafers are expediently supplied to various fabrication and measuring units 1, 2 of the fabrication cell 4 in a parallel fashion. The individual wafers are consecutively fed to various fabrication and measuring units 1, 2 according to the order of processing. After the wafers have passed through all of the treatment processes in the fabrication cell 4, they are reloaded into cassettes and are output to the transport system via the loading and unloading station 7.

The sub-transport system represented in FIG. 2 substantially consists of a conveyor system 11, which includes branches to the individual fabrication units 1 and measuring units 2. Handling devices 12 are provided at these branches, which supply the individual wafers to the fabrication units 1.

In principle, handling devices 12 such as these can also be provided for supplying the measuring units 2.

The singularizing of the wafers is most easily accomplished immediately after a cassette enters the loading and unloading station 7. Operating personnel can singularize the wafers or the wafers can be automatically singularized using handling devices that are not shown in FIG. 2. To accomplish this, the wafers are individually fed into specific branches of the conveyor system 11, whereby they are supplied to the corresponding fabrication 1 unit or measuring unit 2.

There is a functional allocation between the fabrication units 1 and measuring units 2 of a fabrication cell 4, so that the individual finishing steps performed in the fabrication cell 4 combine into a fabrication process.

Several identical fabrication units 1 or measuring units 2 can be provided in the fabrication cell 4, depending upon the capacity of the individual fabrication units 1 and the measuring units 2 and depending upon the various processing times for the individual finishing steps. This prevents bottlenecks and associated wait times in the processing of the wafers in the fabrication cell 4.

In the fabrication cell 4 represented in FIG. 2, fabrication units 1 and measuring units 2 are combined for a lithography process. In this case, three different fabrication units 1 are provided. A fabrication unit 1 is provided for applying photosensitive resist to the wafer. Another fabrication unit 1 is provided for exposing photosensitive resist on the wafers. Lastly, the third fabrication unit 1 is provided for developing photosensitive resist on the wafers.

In the exemplary embodiment represented in FIG. 2, each of the three different fabrication units 1 is operated by a respective handling device 12. In accordance with the capacity required of the fabrication units 1, three such arrangements are provided in the fabrication cell 4. The measuring units 2 for checking the fabrication steps performed in the fabrication units 1 can consist of checking systems which check whether the multi-layer structures exhibited in the interior of the wafers are correctly superimposed. As additional measuring units 2, optical checking devices for detecting faults on the wafers can be provided.

In the exemplary embodiment represented in FIG. 3, two fabrication cells 4, 4' are linked. The structure of the individual fabrication cells 4, 4' substantially corresponds to the structure of the fabrication cells 4 represented in FIG. 2. But unlike the exemplary embodiment represented in FIG. 2, in the linked fabrication cells 4, 4' the loading and unloading station 7 is distributed to various fabrication cells 4, 4'.

Whereas the first fabrication cell includes only a loading station with ports 9 for loading the fabrication cell 4, 4' with cassettes, at the second fabrication cell 4' there is an unloading station with ports 10 for removing the wafers. To link the fabrication cells 4, 4', their sub-transport systems are connected by a handover station 13. The handover station 13 can be formed from a gripper or the like which shuffles wafers from the roll conveyor 11 of one fabrication cell 4 onto the roll conveyor 11 of the other fabrication cell 4.

By linking several fabrication cells 4, 4', the production capacity of the relevant fabrication process can be easily increased. Thus, the overall system can be flexibly adapted to the respectively demanded production capacities by suitably linking fabrication cells 4, 4', accordingly.

I claim:

1. A configuration for processing wafers, comprising:
   a plurality of fabrication units for carrying out individual fabrication steps;

a plurality of measuring units for checking the fabrication steps;

a transport system for transporting cassettes having a predetermined batch size of wafers, said transport system connecting said plurality of said fabrication units and said plurality of said measuring units; and a fabrication cell including a combination of functionally allocated units selected from the group consisting of said plurality of said fabrication units and said plurality of said measuring units;

said fabrication cell including a loading and unloading station for receiving the cassettes with the wafers and for outputting the cassettes with the wafers;

individual ones of the wafers being supplied in a parallel manner to said functionally allocated units in said fabrication cell; and said plurality of said fabrication units, said plurality of said measuring units, said transport system, and said fabrication cell being located in at least one clean room.

2. The configuration according to claim 1, in combination with the wafers, wherein the wafers have individual identification markings.

3. The configuration according to claim 2, comprising:

a sub-transport system for transporting individual ones of the wafers between said functionally allocated units in said fabrication cell.

4. The configuration according to claim 1, comprising:

a sub-transport system for transporting individual ones of the wafers between said functionally allocated units in said fabrication cell.

5. The configuration according to claim 4, wherein said sub-transport system transports the cassettes with the wafers into and out of said fabrication cell.

6. The configuration according to claim 5, wherein said sub-transport system singularizes the wafers.

7. The configuration according to claim 4, wherein said sub-transport system singularizes the wafers.

8. The configuration according to claim 4, wherein said sub-transport system includes a conveyor system.

9. The configuration according to claim 8, wherein said conveyor system includes branches to said functionally allocated units in said fabrication cell.

10. The configuration according to claim 9, comprising handling devices, provided at said conveyor system, for feeding individual ones of the wafers to said functionally allocated units and for removing the individual ones of the wafers from said functionally allocated units.

11. The configuration according to claim 8, comprising handling devices, provided at said conveyor system, for feeding individual ones of the wafers to said functionally allocated units and for removing the individual ones of the wafers from said functionally allocated units.

12. The configuration according to claim 1, wherein said functionally allocated units perform fabrication steps of a fabrication process.

13. The configuration according to claim 12, wherein said functionally allocated units include several identical ones of said plurality of said fabrication units and several identical ones of said plurality of said measuring units in order to achieve a required fabrication capacity for a fabrication process.

14. The configuration according to claim 13, wherein the fabrication process is a lithography process.

15. The configuration according to claim 12, wherein the fabrication process is a lithography process.

16. The configuration according to claim 15, wherein said functionally allocated units include devices for applying a photosensitive resist to the wafers, devices for exposing the photosensitive resist on the wafers, and devices for developing the photosensitive resist on the wafers.

17. The configuration according to claim 16, wherein:

said functionally allocated units include measuring units for checking the lithography process; and said measuring units include a checking system for checking superimposed layer structures in the wafers and an optical checking device for detecting faults on the wafers.

18. The configuration according to claim 15, wherein:

said functionally allocated units include measuring units for checking the lithography process; and said measuring units include a checking system for checking superimposed layer structures in the wafers and an optical checking device for detecting faults on the wafers.

19. The configuration according to claim 1, comprising a plurality of fabrication cells that are linked to one another.

20. The configuration according to claim 1, comprising:

a first fabrication cell defined by said fabrication cell, said first fabrication cell including a first sub-transport system;

a second fabrication cell linked to said first fabrication cell, said second fabrication cell including a second sub-transport system; and a handover station connecting said first sub-transport system and said second sub-transport system to link said first fabrication cell and said second fabrication cell.

21. The configuration according to claim 20, wherein:

said first fabrication cell includes a loading station for receiving the cassettes with the wafers; and said second fabrication cell includes an unloading station for outputting the cassettes with the wafers.

22. The configuration according to claim 19, wherein:

one of said plurality of said fabrication cells includes a loading station for receiving the cassettes with the wafers; and another one of said plurality of said fabrication cells includes an unloading station for outputting the cassettes with the wafers.

* * * * *